(12) United States Patent
Amarnath et al.

(10) Patent No.: US 9,543,030 B1
(45) Date of Patent: Jan. 10, 2017

(54) SENSE AMPLIFIER DESIGN FOR RAMP SENSING

(71) Applicant: SANDISK TECHNOLOGIES INC., Plano, TX (US)

(72) Inventors: Anirudh Amarnath, San Jose, CA (US); Tai-Yuan Tseng, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/924,118

(22) Filed: Oct. 27, 2015

Related U.S. Application Data

(60) Provisional application No. 62/180,617, filed on Jun. 17, 2015.

(51) Int. Cl.
*G11C 16/06* (2006.01)
*G11C 16/26* (2006.01)
*G11C 16/30* (2006.01)

(52) U.S. Cl.
CPC .............. *G11C 16/26* (2013.01); *G11C 16/30* (2013.01)

(58) Field of Classification Search
CPC ..... G11C 16/28; G11C 16/26; G11C 11/5645; G11C 11/5642

USPC .......................................... 365/185.2, 185.21
See application file for complete search history.

(56) References Cited

U.S. PATENT DOCUMENTS

| 8,289,779 | B2 | 10/2012 | Hoei | |
|---|---|---|---|---|
| 8,773,917 | B2 | 7/2014 | Yuh | |
| 2005/0237810 | A1* | 10/2005 | Vali | G11C 7/067 365/185.21 |

* cited by examiner

*Primary Examiner* — Huan Hoang
(74) *Attorney, Agent, or Firm* — Vierra Magen Marcus LLP

(57) ABSTRACT

Methods and systems for sensing memory cells using a sense amplifier that can support both ramp sensing and conventional sensing are described. With ramp sensing, a word line of a memory array may be ramped up linearly and a sensing operation may be performed by the sense amplifier while the word line is continuously being ramped up. In this case, during the sensing operation, the sense amplifier may sense a bit line of the memory array connected to a memory cell while the word line is ramping up and then transfer the result into a data latch. In contrast, with conventional sensing, a bit line of the memory array may be first pre-charged to a particular voltage level (e.g., a read voltage level) and then sensed while the word line is held at the particular voltage level.

20 Claims, 9 Drawing Sheets

SENSE AMPLIFIER DESIGN FOR RAMP SENSING

CLAIM OF PRIORITY

The present application claims priority to U.S. Provisional Application No. 62/180,617, entitled "Sense Amplifier Design for Ramp Sensing," filed Jun. 17, 2015, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

DETAILED DESCRIPTION

Figure 1:
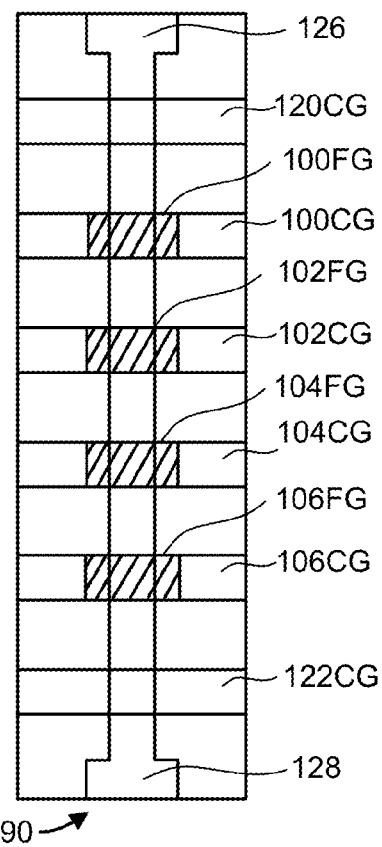
FIG. 1 depicts one embodiment of a NAND string.

Technology is described for sensing memory cells using a sense amplifier that can support both ramp sensing and conventional sensing. With ramp sensing, a word line of a memory array may be ramped up linearly and a sensing operation may be performed by the sense amplifier while the word line is continuously being ramped up. In this case, during the sensing operation, the sense amplifier may sense a bit line of the memory array connected to a memory cell while the word line is ramping up and then transfer the result (e.g., based on the SEN level of the sense amplifier) into a data latch. In contrast, with conventional sensing, a bit line of the memory array may be first precharged to a particular voltage level (e.g., a read voltage level) and then sensed while the word line is held at the particular voltage level. In this case, the word line may first settle at the particular voltage level prior to the sensing operation and then the sense amplifier may perform the sensing operation while the word line remains at the particular voltage level.

In one embodiment, while a word line of a memory array is ramping up (e.g., ramping up from 200 mV to 5.5V at 100 mV per microsecond), a sense amplifier may perform one or more sensing operations. During a sensing operation of the one or more sensing operations, the sense amplifier may precharge a bit line electrically coupled to the sense amplifier to a first voltage (e.g., 2V) and precharge a sensing node (SEN) of the sense amplifier to a second voltage greater than the first voltage (e.g., 4V). The precharge path for precharging the sensing node may be different from the sensing path for determining if the sensing node has dropped below the second voltage by a particular amount due to current flowing from the sensing node to the bit line during the sensing operation. In some cases, if the sensing node drops to a transistor threshold voltage (e.g., a PMOS transistor threshold voltage) below the second voltage, then the sensing path may detect that the sensing node has dropped below the second voltage by at least the transistor threshold voltage and latch the result causing the precharge path to be disabled during subsequent sensing operations of the one or more sensing operations. The precharge path may be disabled via a feedback node (LBUS) connected to a feedback circuit that pulls up the feedback node to disable the precharge path if the feedback circuit detects that the feedback node has risen more than a transistor threshold voltage (e.g., an NMOS transistor threshold voltage) above ground. The active pull up on the feedback node due to the feedback circuit allows for faster sensing of the sensing node, faster disabling of the precharge path, and less memory cell state data dependence on the precharge time of the sensing node via the precharge path during subsequent sensing operations.

In some cases, the sense amplifier may be used during even/odd sensing (e.g., only even bit lines or only odd bit lines are sensed during a sensing operation) or all-bit-line (ABL) sensing (e.g., both even bit lines and odd bit lines are sensed during a sensing operation). The sense amplifier may be used during either ramp sensing and conventional sensing and the active pull up on the feedback node (LBUS) for reducing data dependence on the precharge time of the sensing node via the precharge path may be selectively enabled such that the active pull up is enabled only during ramp sensing.

The methods and systems described herein may be used for sensing memory cells within a non-volatile storage system. In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
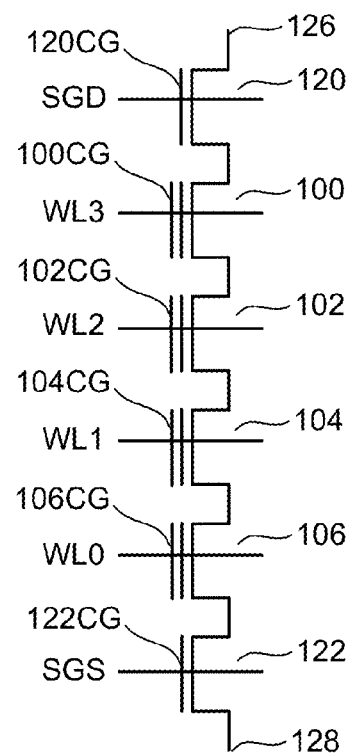
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
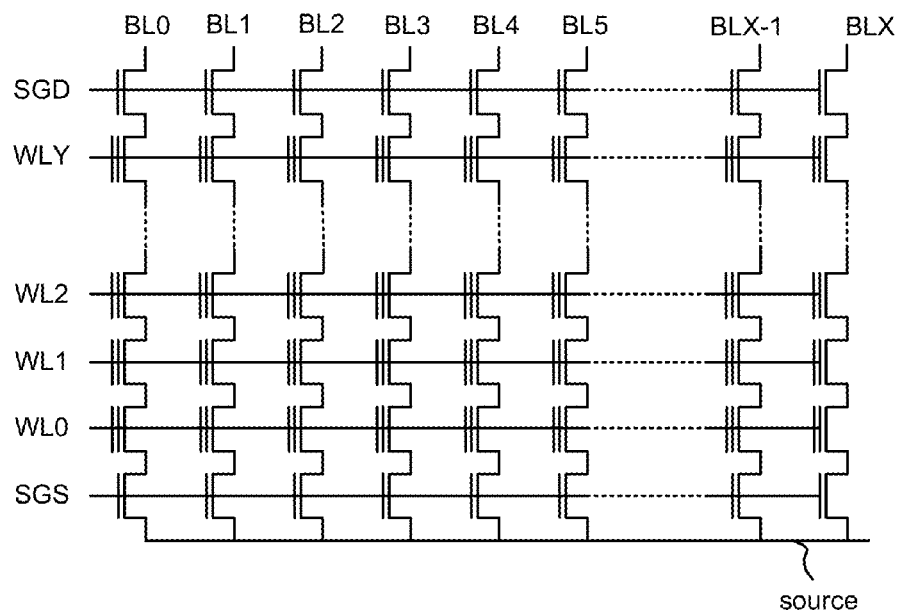
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
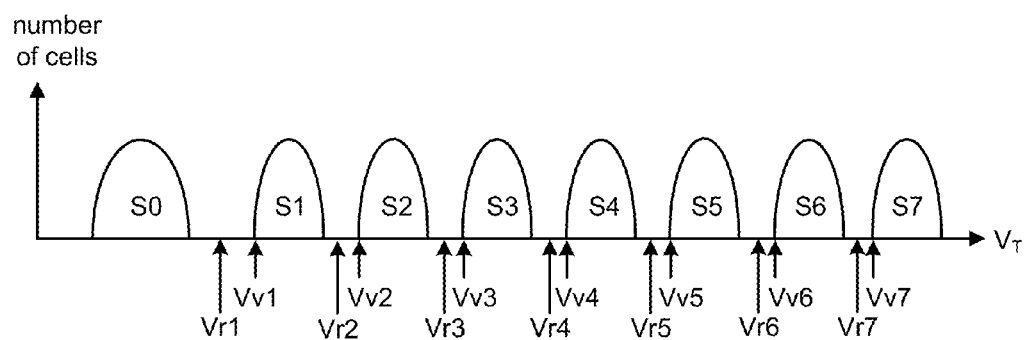
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 4A:
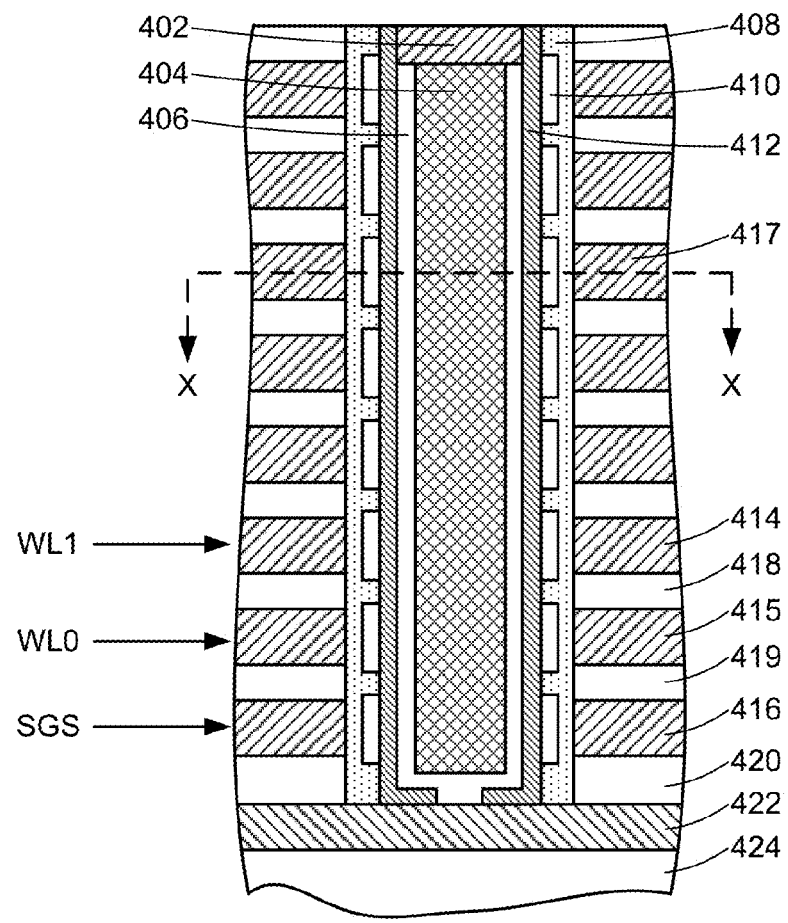
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
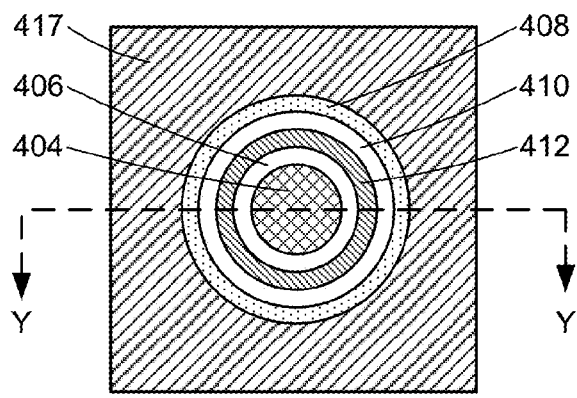
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

In some embodiments, a vertical NAND structure may include a vertical NAND string formed above a substrate and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5A:
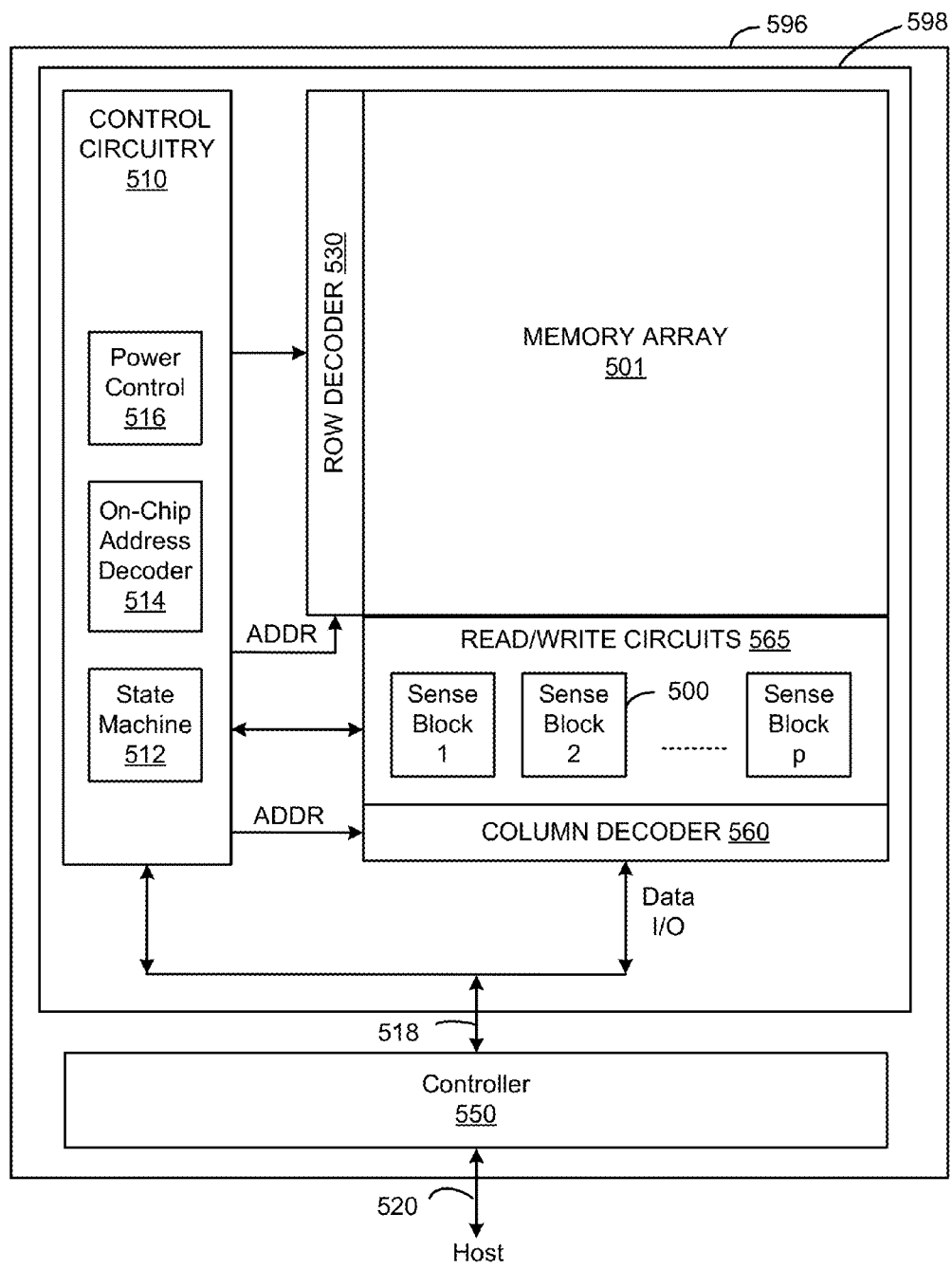
FIG. 5A depicts one embodiment of a non-volatile storage system.

FIG. 5A depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, and/or controller 550. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5B:
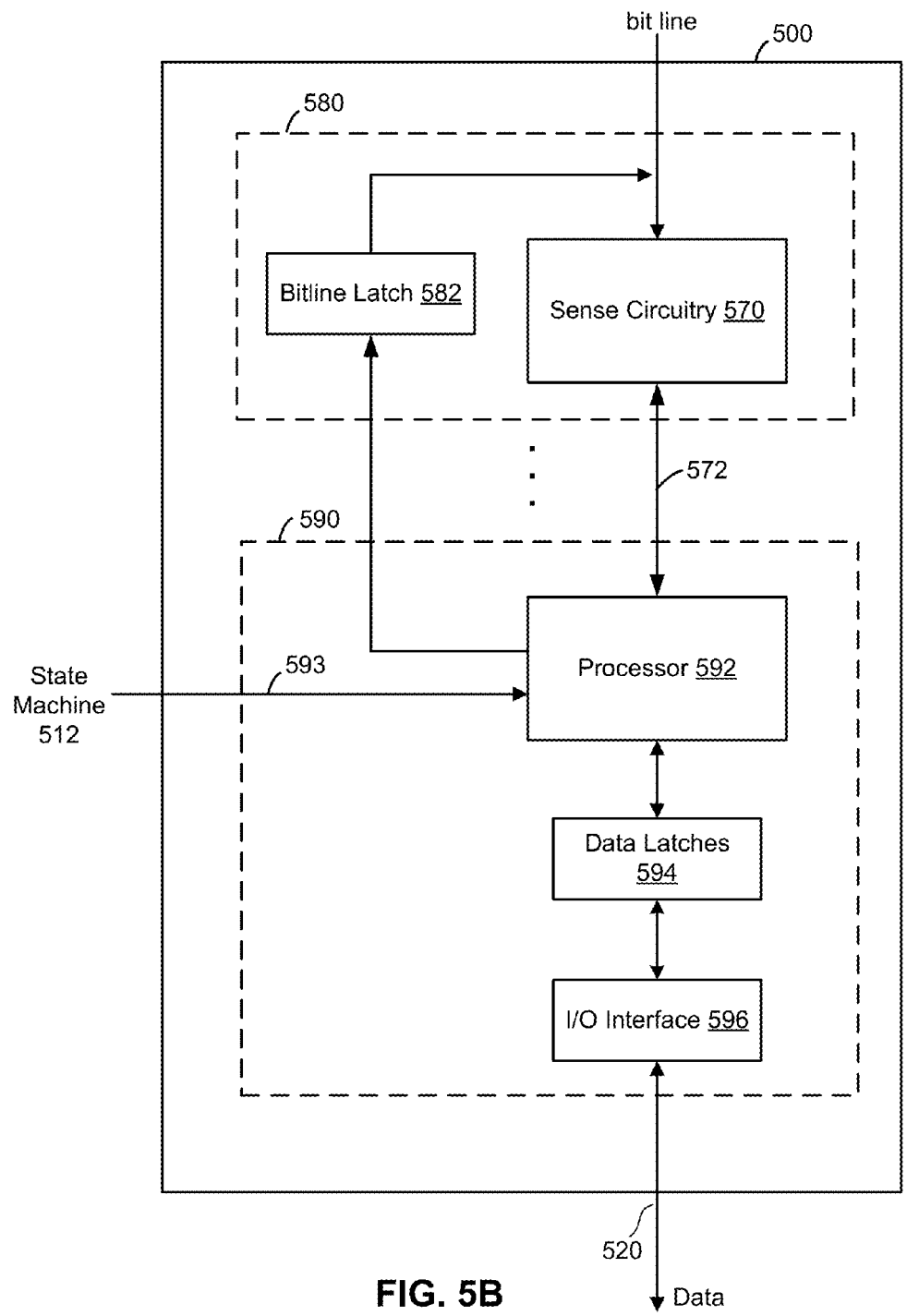
FIG. 5B depicts one embodiment of a sense block.

FIG. 5B depicts one embodiment of a sense block 500, such as sense block 500 in FIG. 5A. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block may include one common portion 590 and eight sense modules 580. Each of the sense modules in a group may communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5A. I/O interface 596 provides an interface between data latches 594 and the data bus 520.

During a read operation or other storage element sensing operation, a state machine, such as state machine 512 in FIG. 5A, controls the supply of different control gate voltages to the addressed storage elements. In some cases, as it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

In some embodiments, a non-volatile storage system, such as non-volatile storage system 596 in FIG. 5A, may be implemented using an integrated circuit. The integrated circuit may include on-chip circuitry to generate a boosted voltage having a magnitude that is greater than the highest power supply voltage provided to the integrated circuit. The boosted voltage may be used for providing power to portions of the electronic circuitry located on the integrated circuit. The boosted voltage may be generated using an on-chip charge pump system. In some cases, a charge pump system may be used to generate an output voltage that is greater than the highest supply voltage provided to the integrated circuit. In other cases, a charge pump system may be used to generate an output voltage that is less than the lowest supply voltage provided to the integrated circuit (e.g., a negative charge pump system may generate a voltage that is less than ground or VSS).

Figure 6A:
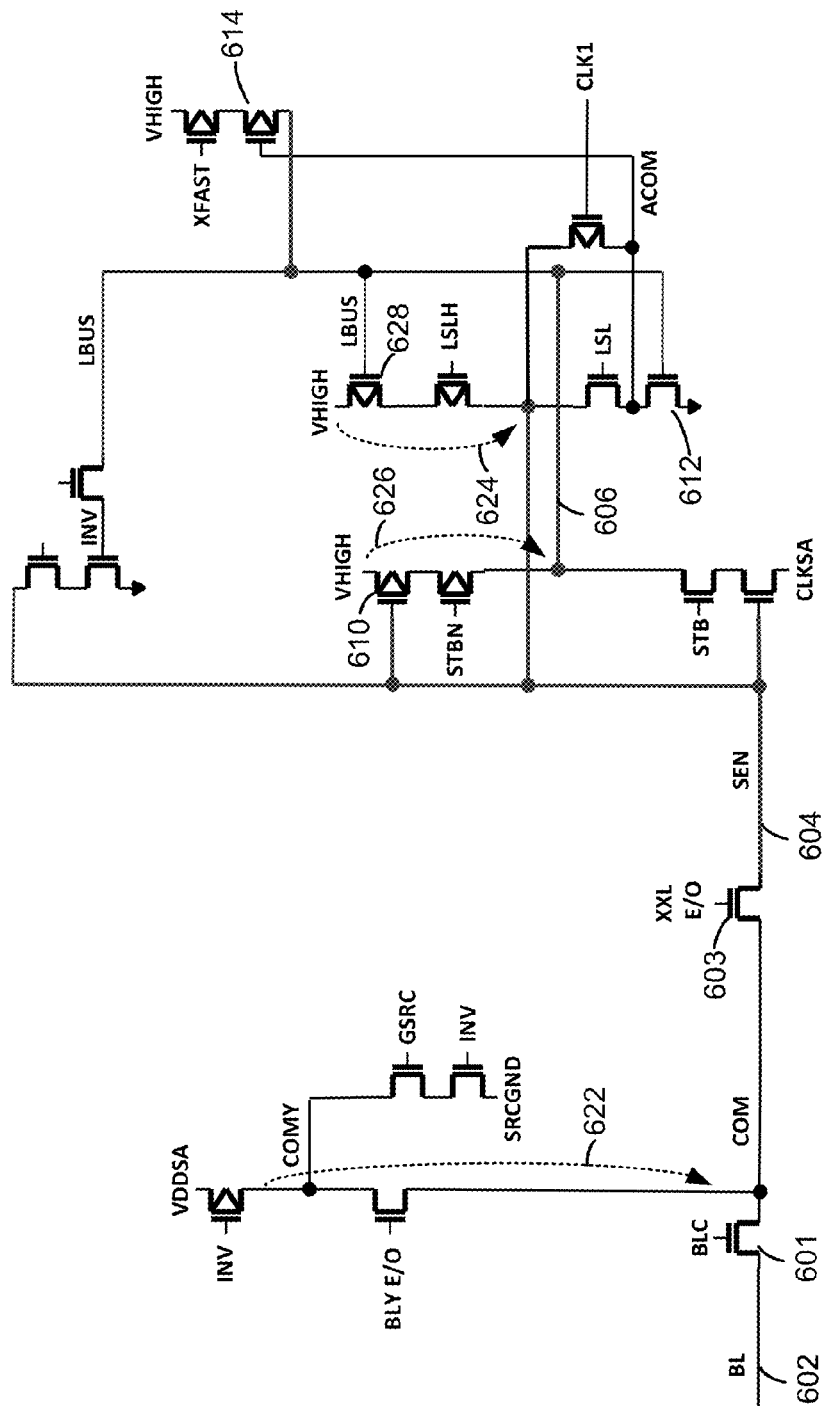
FIG. 6A depicts one embodiment of a portion of a sense amplifier.

FIG. 6A depicts one embodiment of a portion of a sense amplifier. In some cases, the portion of the sense amplifier may correspond with a portion of sense module 580 in FIG. 5B. As depicted, the portion of the sense amplifier includes a bit line BL 602 connected at the source side of an NMOS transistor 601 with a gate controlled by BLC. During a sensing operation, the NMOS transistor 601 may be set into a source follower configuration in which the bit line is biased to a bit line voltage via application of the appropriate voltage to BLC (e.g., setting BLC to roughly an NMOS transistor threshold voltage above the bit line voltage). The NMOS transistor threshold voltage may be elevated due to the body effect. The precharge path for precharging the bit line BL 602 may be via precharge path 622.

Prior to sensing current drawn from the bit line BL 602 during the sensing operation, the bit line BL 602 may be precharged to a first voltage VDDSA (e.g., 2V) and the sensing node SEN 604 that is electrically coupled to the bit line BL 602 may be precharged to a second voltage VHIGH that is greater than the first voltage (e.g., 4V) via a precharge path 624 for precharging the sensing node. During the sensing operation, as charge is drawn from the sensing node, the voltage at the sensing node may reduce or drop from the second voltage. As the voltage of the sensing node SEN 604 drops, the voltage of the feedback node LBUS 606 may increase via the sensing path 626 as PMOS transistor 610 turns on or is set into a conducting state.

In one embodiment, if the sensing node SEN 604 drops more than a PMOS transistor threshold voltage below the second voltage VHIGH, then the feedback node LBUS 606 may be charged up via the sensing path 626. As the voltage of the feedback node LBUS 606 is increased, the NMOS transistor 612 may be turned on or set into a conducting state causing the PMOS transistor 614 to be turned on or set into a conducting state. As the drain of the PMOS transistor 614 is connected to the feedback node LBUS 606, the active pull-up via the PMOS transistor 614 may quickly raise the voltage of the feedback node LBUS 606 to the second voltage VHIGH. Once the feedback node LBUS 606 has been pulled up to the second voltage, the precharge path 624 for precharging the sensing node SEN 604 may be disabled as the PMOS transistor 628 has been turned off or set into a non-conducting state. If the feedback node LBUS 606 has not been charged up to a voltage sufficient to turn off the PMOS transistor 628, then the sensing node SEN 604 will be precharged during a subsequent precharge phase for a subsequent sensing operation via the precharge path 624.

Figure 6B:
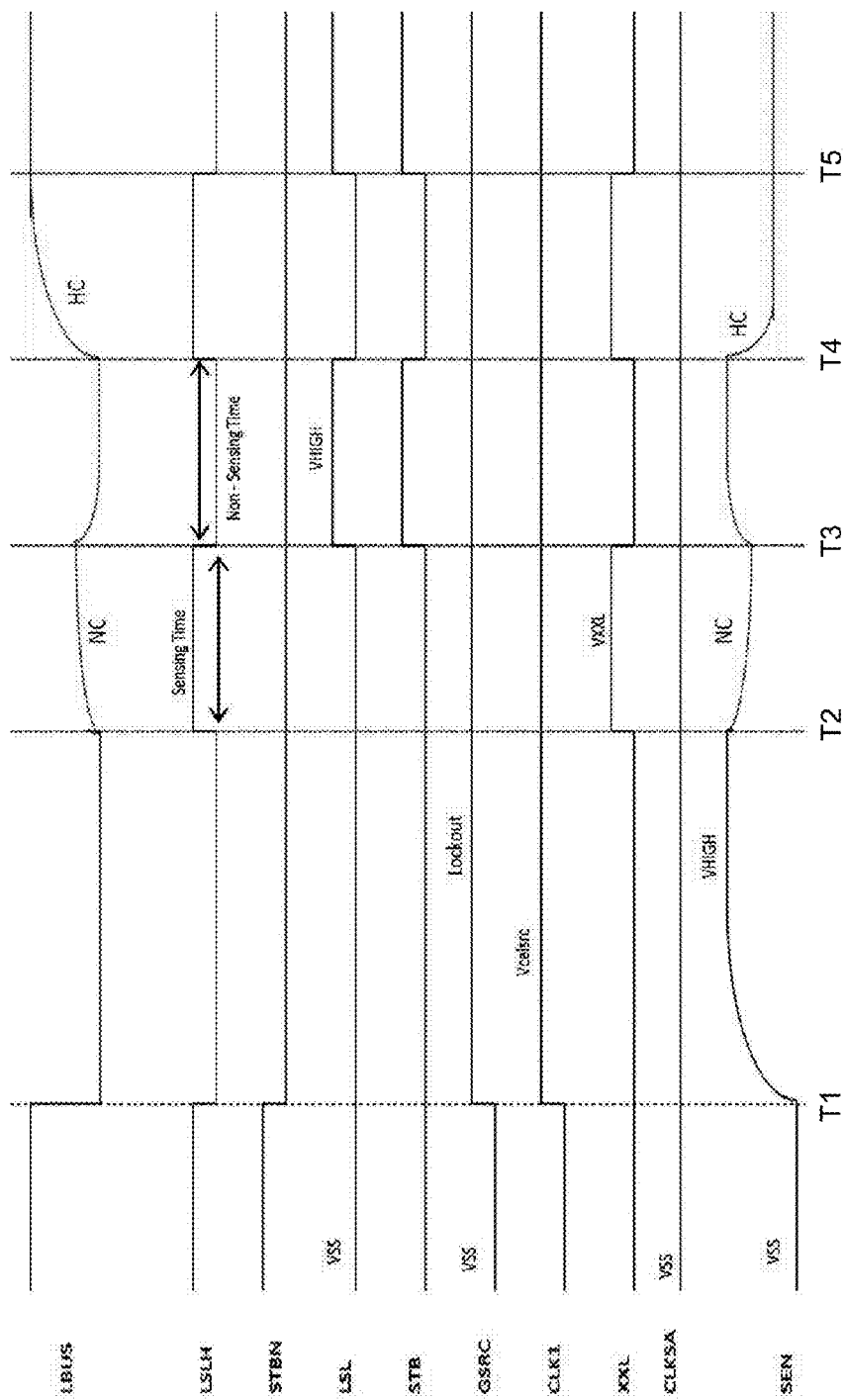
FIG. 6B depicts one embodiment of voltage waveforms corresponding with operation of the portion of the sense amplifier depicted in FIG. 6A.

FIG. 6B depicts one embodiment of voltage waveforms corresponding with operation of the portion of the sense amplifier depicted in FIG. 6A. As depicted, at time T1, LBUS and LSLH transition from a high voltage (e.g., VHIGH) to a low voltage (e.g., 0V) causing the sensing node SEN to be precharged to VHIGH via the precharge path 624. The ACOM node that drives the gate of the PMOS transistor 614 is also set to VHIGH. At time T2, LSLH transitions from the low voltage to the high voltage cutting off the precharge path 624 and the NMOS transistor 603 is set into a conducting state such that the sensing node SEN 604 is electrically coupled or connected to the bit line BL 602.

As depicted, between times T2 and T3, a first sensing operation is performed in which the word line voltage applied to a memory cell connected to the bit line BL 602 is not sufficient to set the memory cell into a highly conducting state (HC) and instead the memory cell remains in a non-conducting state (NC). Due to charge leakage from the sensing node (e.g., due to parasitic leakage currents), the voltage of the sensing node may drop slightly; however, as the feedback node LBUS 606 has not been pulled up sufficiently to cut off the PMOS transistor 628, the precharge path 624 will be enabled once LSLH falls. At time T3, LSLH falls causing the precharge path 624 to charge up the sensing node SEN 604 up to VHIGH and STB rises causing the feedback node LBUS to fall to VSS or 0V. At time T4, LSLH transitions from the low voltage to the high voltage cutting off the precharge path 624 and the NMOS transistor 603 is set into a conducting state such that the sensing node SEN 604 is electrically coupled or connected to the bit line BL 602. In this case, between times T4 and T5, a second sensing operation is performed in which the word line voltage applied to the memory cell is sufficient to set the memory cell into a conducting state or a highly conducting state (HC) causing the voltage of the sensing node SEN 604 to fall and the voltage of the feedback node LBUS 606 to be pulled up via the sensing path 626. In the case that XFAST is low enabling the feedback circuit comprising PMOS transistor 614 and NMOS transistor 612, once LBUS is charged up to the threshold voltage of the NMOS transistor 612, the gate of the PMOS transistor 614 will be pulled to ground causing the PMOS transistor 614 to pull up the feedback node LBUS 606 to VHIGH. This active pull up on the feedback node LBUS 606 caused by the configuration of PMOS transistor 614 and NMOS transistor 612 allows the precharge path 624 to be quickly disabled and also reduces the memory cell state data dependence on the precharge time of the sensing node via the precharge path 624 during subsequent sensing operations. At time T5, LSLH falls, but the sensing node SEN 604 is not charged up to VHIGH as the feedback node LBUS 606 has been pulled up to VHIGH setting PMOS transistor 628 into a non-conducting state and cutting off the precharge path 624.

Figure 7A:
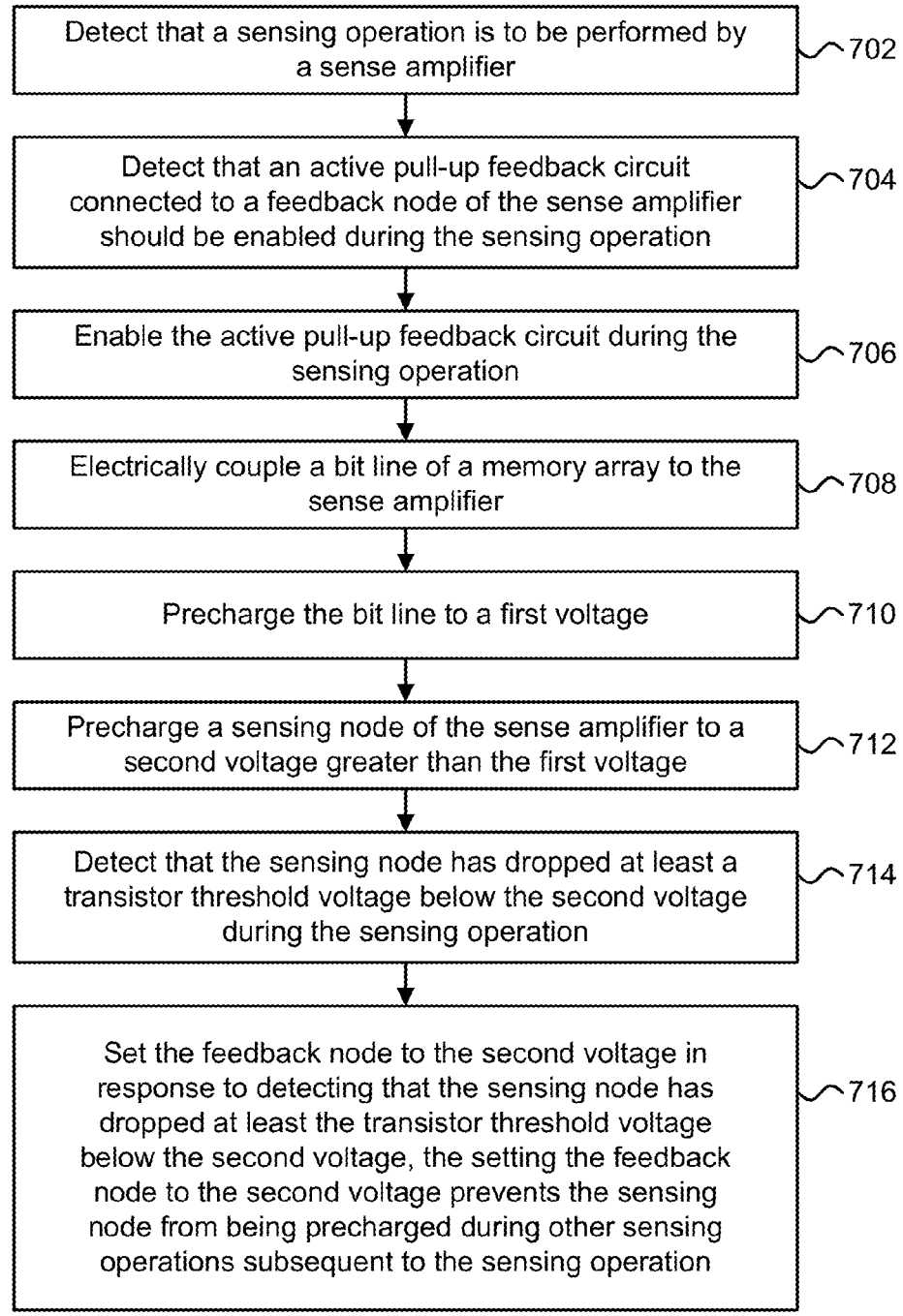
FIG. 7A is a flowchart describing one embodiment of a process for sensing memory cells using a sense amplifier.

FIG. 7A is a flowchart describing one embodiment of a process for sensing memory cells using a sense amplifier. In one embodiment, the process of FIG. 7A may be performed by a sense block, such as sense block 500 in FIG. 5B, or a sense amplifier, such as the sense amplifier depicted in FIG. 6A.

In step 702, it is detected that a sensing operation is to be performed by a sense amplifier. In step 704, it is detected that an active pull-up feedback circuit connected to a feedback node of the sense amplifier should be enabled during the sensing operation. In one embodiment, the active pull-up feedback circuit is enabled in response to detecting that a word line voltage applied to a word line of a memory array is ramping up during the sensing operation or detecting that ramp sensing is to be performed during the sensing operation. In another embodiment, the active pull-up feedback circuit is enabled in response to detecting that even/odd sensing is to be performed during the sensing operation. In another embodiment, the active pull-up feedback circuit is enabled in response to detecting that a temperature associated with a memory array is greater than a temperature threshold. In another embodiment, the active pull-up feedback circuit is enabled in response to detecting that a power supply voltage provided to the sense amplifier or provided to a memory chip that includes the sense amplifier is less than a particular voltage (e.g., is less than 2.7V).

In step 706, the active pull-up feedback circuit is enabled during the sensing operation. In step 708, a bit line of a memory array is electrically coupled to the sense amplifier during the sensing operation. In step 710, the bit line is precharged to a first voltage (e.g., to a read voltage such as 2V). In step 712, a sensing node of the sense amplifier is precharged to a second voltage greater than the first voltage (e.g., to 3.5V or 4V). In step 714, it is detected that the sensing node has dropped at least a transistor threshold voltage below the second voltage during the sensing operation. In one example, the sensing node may drop more than a PMOS transistor threshold voltage below the second voltage during the sensing operation. In step 716, the feedback node is set to the second voltage in response to detecting that the sensing node has dropped at least the transistor threshold voltage below the second voltage. In some cases, setting the feedback node to the second voltage may prevent the sensing node from being precharged during other sensing operations subsequent to the sensing operation. In one example, the feedback node may be set to a high voltage (e.g., VHIGH or 4V) and the state of the feedback node may be latched or held at the high voltage for one or more sensing operations subsequent to the sensing operation.

In one embodiment, the precharge path for precharging the sensing node to the second voltage may be different from the sensing path for detecting that the sensing node has dropped at least the transistor threshold voltage below the second voltage. In some cases, the precharge path may be disabled via the feedback node that is connected to a feedback circuit that pulls up the feedback node to disable the precharge path if the feedback circuit detects that the feedback node has risen more than a transistor threshold voltage (e.g., an NMOS transistor threshold voltage) above ground.

In some embodiments, even/odd sensing may be utilized in which even bit lines are sensed during a first time period and the odd bit lines are sensed during a second time period subsequent to the first time period. To speed up sensing of memory cells during even/odd sensing, the active pull-up feedback circuit connected to the feedback node of the sense amplifier may be enabled during both the first time period and the second time period.

Figure 7B:
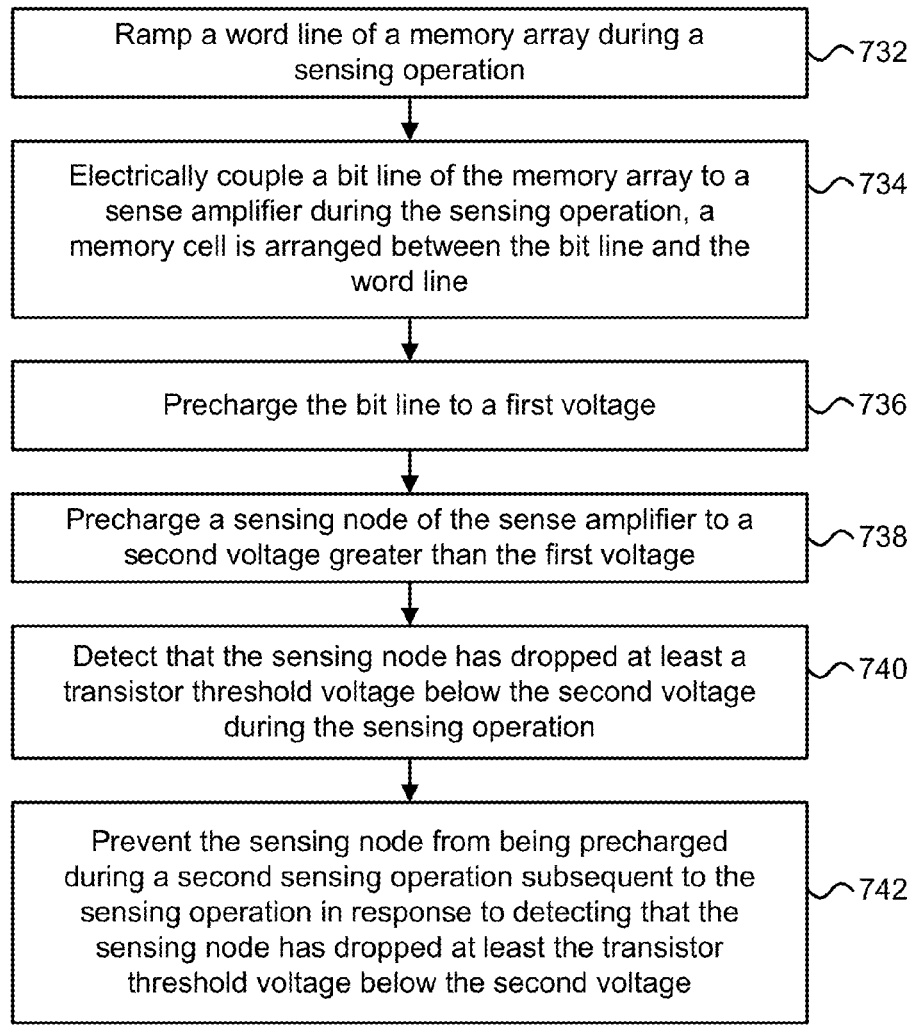
FIG. 7B is a flowchart describing another embodiment of a process for sensing memory cells using a sense amplifier.

FIG. 7B is a flowchart describing another embodiment of a process for sensing memory cells using a sense amplifier. In one embodiment, the process of FIG. 7B may be performed by a sense block, such as sense block 500 in FIG. 5B, or a sense amplifier, such as the sense amplifier depicted in FIG. 6A.

In step 732, a word line of a memory array is ramped up during a sensing operation. In one example, the word line may be ramped up from 100 mV to 4.5V at 200 mV per microsecond. In step 734, a bit line of the memory array is electrically coupled to a sense amplifier during the sensing operation. A memory cell of the memory array to be sensed may be arranged between the bit line and the word line. In step 736, the bit line is precharged to a first voltage (e.g., 2V). In step 738, a sensing node of the sense amplifier is precharged to a second voltage greater than the first voltage (e.g., 4V). In step 740, it is detected that the sensing node has dropped at least a transistor threshold voltage below the second voltage during the sensing operation. In step 742, the sensing node is disabled or prevented from being precharged during a second sensing operation subsequent to the sensing operation in response to detecting that the sensing node has dropped at least the transistor threshold voltage below the second voltage. In this case, a feedback node of the sense amplifier may be set to the second voltage in response to detecting that the sensing node has dropped at least the transistor threshold voltage below the second voltage. In some cases, setting the feedback node to the second voltage may prevent the sensing node from being precharged during the second sensing operation subsequent to the sensing operation.

One embodiment of the disclosed technology includes a sensing circuit and a feedback circuit. The sensing circuit configured to precharge a sensing node of the sensing circuit to a second voltage if a voltage of a feedback node of the sensing circuit is less than a second transistor threshold voltage below the second voltage. The sensing circuit configured to charge up the feedback node in response to a voltage of the sensing node dropping at least a first transistor threshold voltage below the second voltage during a sensing operation. The feedback circuit configured to set the feedback node to the second voltage if the voltage of the feedback node rises to more than a third transistor threshold voltage above ground during the sensing operation.

One embodiment of the disclosed technology includes precharging a sensing node of a sense amplifier to a second voltage, detecting that the sensing node has dropped at least a transistor threshold voltage below the second voltage during a sensing operation, and disabling the sensing node from being precharged during one or more other sensing operations subsequent to the sensing operation in response to detecting that the sensing node has dropped at least the first transistor threshold voltage below the second voltage. The disabling the sensing node includes setting a feedback node of the sense amplifier to the second voltage using a feedback circuit that pulls up the feedback node to the second voltage if the feedback circuit detects that the feedback node has risen more than a second transistor threshold voltage above ground.

One embodiment of the disclosed technology includes a sense amplifier and a feedback circuit. The sense amplifier including a precharge path and a sensing path. The sense amplifier configured to precharge a sensing node of the sense amplifier to a second voltage using the precharge path and detect that a voltage of the sensing node has dropped at least a PMOS transistor threshold voltage below the second voltage using the sensing path during a sensing operation. The sense amplifier configured to charge up a feedback node of the sense amplifier in response to the voltage of the sensing node dropping at least the PMOS transistor threshold voltage below the second voltage during the sensing operation. The feedback circuit configured to disable the sensing node from being precharged during one or more other sensing operations subsequent to the sensing operation in response to the feedback node rising to more than an NMOS transistor threshold voltage above ground during the sensing operation.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a sensing circuit configured to precharge a sensing node of the sensing circuit to a second voltage if a voltage of a feedback node of the sensing circuit is less than a second transistor threshold voltage below the second voltage, the sensing circuit configured to charge up the feedback node in response to a voltage of the sensing node dropping at least a first transistor threshold voltage below the second voltage during a sensing operation; and
a feedback circuit configured to set the feedback node to the second voltage if the voltage of the feedback node rises to more than a third transistor threshold voltage above a reference voltage during the sensing operation.

2. The apparatus of claim 1, wherein:
the sensing circuit configured to prevent the sensing node from precharging during one or more other sensing operations subsequent to the sensing operation in response to the feedback node being set to the second voltage; and
the reference voltage is ground.

3. The apparatus of claim 1, wherein:
the sensing circuit configured to enable the feedback circuit during the sensing operation in response to a determination that a word line is transitioning from a first voltage to a second voltage greater than the first voltage during the sensing operation.

4. The apparatus of claim 1, wherein:
the sensing circuit configured to enable the feedback circuit during the sensing operation in response to a determination that a power supply voltage to the sensing circuit is below a particular voltage level.

5. The apparatus of claim 1, wherein:
the first transistor threshold voltage corresponds with a first PMOS transistor threshold voltage;
the second transistor threshold voltage corresponds with a second PMOS transistor threshold voltage; and
the third transistor threshold voltage corresponds with an NMOS transistor threshold voltage.

6. The apparatus of claim 1, wherein:
the sensing circuit configured to precharge a bit line of a memory array to a first voltage less than the second voltage and electrically couple the bit line to the sensing node during the sensing operation.

7. The apparatus of claim 6, wherein:
the sensing circuit configured to enable the feedback circuit during the sensing operation in response to a determination that a temperature associated with the memory array is above a temperature threshold.

8. The apparatus of claim 6, wherein:
the memory array comprises a three-dimensional memory array.

9. The apparatus of claim 6, wherein:
the memory array comprises a non-volatile memory that is monolithically formed in one or more physical levels of memory cells having active areas disposed above a silicon substrate.

10. A method, comprising:
precharging a sensing node of a sense amplifier to a second voltage;

detecting that the sensing node has dropped at least a transistor threshold voltage below the second voltage during a sensing operation; and disabling the sensing node from precharging during one or more other sensing operations subsequent to the sensing operation in response to detecting that the sensing node has dropped at least the first transistor threshold voltage below the second voltage, the disabling the sensing node includes setting a feedback node of the sense amplifier to the second voltage using a feedback circuit that pulls up the feedback node to the second voltage if the feedback circuit detects that the feedback node has risen more than a second transistor threshold voltage above a reference voltage.

11. The method of claim 10, further comprising:

detecting that a word line is ramping up during the sensing operation; and enabling the feedback circuit during the sensing operation in response to detecting that the word line is ramping up during the sensing operation.

12. The method of claim 10, further comprising:

determining that even/odd sensing is to be performed during the sensing operation; and enabling the feedback circuit during the sensing operation in response to determining that even/odd sensing is to be performed during the sensing operation.

13. The method of claim 10, further comprising:

detecting that a power supply voltage to the sense amplifier is below a particular voltage level; and enabling the feedback circuit during the sensing operation in response to detecting that the power supply voltage to the sense amplifier is below the particular voltage level.

14. The method of claim 10, wherein:

the first transistor threshold voltage corresponds with a PMOS transistor threshold voltage; and the second transistor threshold voltage corresponds with an NMOS transistor threshold voltage.

15. The method of claim 10, further comprising:

precharging a bit line of a memory array to a first voltage less than the second voltage using the sense amplifier; and electrically coupling the bit line to the sensing node during the sensing operation.

16. The method of claim 15, further comprising:

detecting that a temperature associated with the memory array is above a temperature threshold; and enabling the feedback circuit during the sensing operation in response to detecting that the temperature associated with the memory array is above the temperature threshold.

17. The method of claim 15, wherein:

the memory array comprises a three-dimensional memory array; and the reference voltage is ground.

18. The method of claim 15, wherein:

the memory array comprises a non-volatile memory that is monolithically formed in one or more physical levels of memory cells having active areas disposed above a silicon substrate.

19. A system, comprising:

a sense amplifier including a precharge path and a sensing path, the sense amplifier configured to precharge a sensing node of the sense amplifier to a second voltage using the precharge path and detect that a voltage of the sensing node has dropped at least a PMOS transistor threshold voltage below the second voltage using the sensing path during a sensing operation, the sense amplifier configured to charge up a feedback node of the sense amplifier in response to the voltage of the sensing node dropping at least the PMOS transistor threshold voltage below the second voltage during the sensing operation; and a feedback circuit configured to disable the sensing node from precharging during one or more other sensing operations subsequent to the sensing operation in response to the feedback node rising to more than an NMOS transistor threshold voltage above a reference voltage during the sensing operation.

20. The system of claim 19, wherein:

the sense amplifier configured to enable the feedback circuit during the sensing operation in response to a determination that a word line is ramping up during the sensing operation; and the reference voltage is ground.

* * * * *